United States Patent
Oki et al.

[11] Patent Number: 5,892,248
[45] Date of Patent: Apr. 6, 1999

[54] DOUBLE PHOTORESIST LAYER SELF-ALIGNED HETEROJUCTION BIPOLAR TRANSISTOR

[75] Inventors: Aaron K. Oki, Torrance; Donald K. Umemoto, Manhattan Beach; Liem T. Tran, Torrance; Dwight C. Streit, Seal Beach, all of Calif.

[73] Assignee: TRW Inc., Redondo Beach, Calif.

[21] Appl. No.: 720,388

[22] Filed: Sep. 30, 1996

Related U.S. Application Data

[62] Division of Ser. No. 647,609, May 13, 1996.

[51] Int. Cl.$^6$ ............... H01L 31/0328; H01L 31/0336; H01L 27/082
[52] U.S. Cl. ................ 257/197; 257/198; 257/587
[58] Field of Search ................... 257/197, 198

[56] References Cited

U.S. PATENT DOCUMENTS

| | | | |
|---|---|---|---|
| 5,219,713 | 6/1993 | Robinson | 430/314 |
| 5,412,233 | 5/1995 | Dubon-Chevallier et al. | 257/197 |
| 5,472,886 | 12/1995 | Dautartas et al. | 437/23 |
| 5,665,614 | 9/1997 | Hafizi et al. | 438/320 |

*Primary Examiner*—Wael Fahmy
*Attorney, Agent, or Firm*—Michael S. Yatsko

[57] ABSTRACT

A heterojunction bipolar transistor and a method for fabricating an HBT with self-aligned base metal contacts using a double photoresist, which requires fewer process steps than known methods, while minimizing damage to the active emitter contact region. In particular, a photoresist is used to form the emitter mesa. The emitter mesa photoresist is left on and a double polymethylmethacrylate (PMMA) and photoresist layer is then applied. The triple photoresist combination is patterned to create a non-critical lateral alignment for the base metal contacts to the emitter mesa, which permits selective base ohmic metal deposition and lift-off. By utilizing the double photoresist as opposed to a metal or dielectric for masking, an additional photolithography step and etching step is eliminated. By eliminating the need for an additional etching step, active regions of the semiconductors are prevented from being exposed to the etching step and possibly damaged.

6 Claims, 5 Drawing Sheets

DOUBLE PHOTORESIST LAYER SELF-ALIGNED HETEROJUCTION BIPOLAR TRANSISTOR

This is a divisional of U.S. patent application Ser. No. 08/647,609, filed May 13, 1996.

BACKGROUND OF THE INVENTION

1. Field of the Invention

The present invention relates to a heterojunction bipolar transistor (HBT) and a method for fabricating an HBT, and more particularly to an HBT with self-aligned base metal contacts utilizing a double photoresist, which requires fewer process steps than known methods, while minimizing damage to the active emitter contact region.

2. Description of the Prior Art

Processes for fabricating heterojunction bipolar transistors (HBTs) are known in the art. Examples of such processes are disclosed in U.S. Pat. Nos. 5,298,439 and 5,344,786, hereby incorporated by reference. An important consideration in fabricating HBTs is the method for forming the base metal contacts to emitter mesa spacing in a minimal, reproducible method.

The '786 patent discloses the use of a dielectric material formed by chemical vapor deposition on top of an emitter layer. A photoresist is spun on top of the dielectric layer. An emitter dielectric island is formed by reactive ion etching. Another dielectric is deposited over the emitter dielectric island forming protective side walls and a dielectric layer on top of the flat surface of the semiconductor. The side walls, formed on the emitter dielectric island, overhang the emitter mesa and thus serve to locate the best base metal contacts on the base layer away from the emitter mesa. The dielectric layer on the flat surface of the semiconductors is removed by anisotropic etching. In order to locate the base metal contacts, a photoresist is used. Base metal is evaporated on top. The dielectric also acts as a mask for the base metal contacts. Removal of the photoresist lifts off the base metal except for the masked portion to form the base metal contacts.

The '439 patent discloses the use of an emitter metal, patterned on a portion of the emitter contact layer by photolithography. The emitter metal is used as a mask for etching the emitter contact layer in a portion of the emitter layer beneath, to form an emitter mesa. A photoresist is spun over the emitter mesa to enable the remaining portion of the emitter to be exposed. Etching is used to expose the base layer to enable the base metal contacts to be formed.

In both the '439 and '786 patents, a dielectric or ohmic metal is used as a mask for the emitter mesa. Unfortunately, both of these techniques require a separate process step to etch the dielectric or metal mask after the mesa is formed. In addition, etching of the insulator or base metal exposes an active emitter contact region to an etching process, which can cause damage.

SUMMARY OF THE INVENTION

It is an object of the present invention to solve various problems in the prior art.

It is yet another object of the present invention to provide a method for fabricating a semiconductor with fewer process steps.

It is yet another object of the present invention to fabricate a semiconductor without unnecessarily exposing an active emitter region of the semiconductor to an etching process.

It is yet a further object of the present invention to provide a method for forming a heterojunction bipolar transistor (HBT) with self-aligned base metal contacts.

Briefly, the present invention relates to a heterojunction bipolar transistor (HBT) and a method for fabricating an HBT with self-aligned base metal contacts using a double photoresist, which requires fewer process steps than known methods, while minimizing damage to the active emitter contact region. A photoresist is used to form the emitter mesa. The emitter mesa photoresist is left on the wafer and a double-layered photoresist combination of polymethylmethacrylate (PMMA) and photoresist is then spun on the semiconductor. The double photoresist combination is patterned with a non-critical lateral alignment which permits selective base ohmic metal deposition and lift-off. The metal-to-mesa spacing is formed from the previous photoresist level that is left on the wafer (self-aligned), thereby making the ohmic metal photoresist level a non-critical alignment. By making the ohmic metal self-aligned, the base ohmic metal to emitter mesa spacing becomes very repeatable and reproducible. By utilizing the double photoresist as opposed to a metal or dielectric for masking, an additional photolithography step and etching step is eliminated. By eliminating the need for an additional etching step, active regions of the semiconductors are prevented from being exposed to the etching step and possibly damaged.

BRIEF DESCRIPTION OF THE DRAWING

These and other objects of the present invention will be readily understood with reference to the following specification and attached drawing, wherein.

DETAILED DESCRIPTION OF THE INVENTION

The present invention relates to a heterojunction bipolar transistor (HBT) and a process for fabricating an HBT that utilizes self-alignment of the base metal contact to the emitter mesa without the need to utilize a dielectric or metal mask which requires an additional photolithography step, as well as an additional etching step. By eliminating the additional photolithography step, the cycle time in fabricating such HBTs is thus greatly reduced, thus reducing the price and cost of the device and increasing yield due to less handling and increased potential of breaking the wafer. In addition, the elimination of the etching step prevents exposures of active areas of the semiconductor from a potentially damaging etching step.

Figure 1:
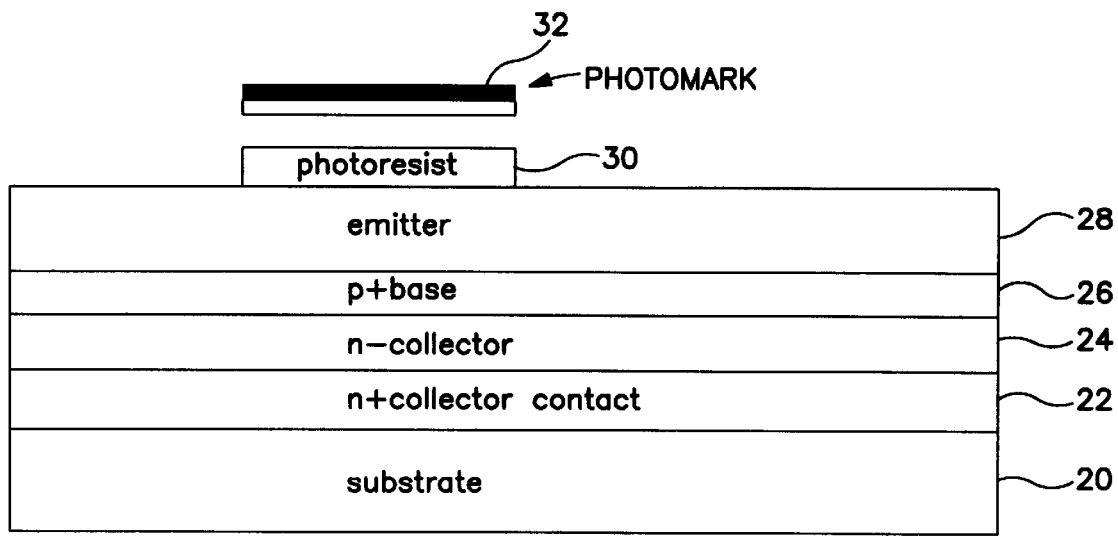
FIG. 1 is an elevational view of the method for fabricating a heterojunction bipolar transistor (HBT) after the substrate, collector, collector contact, base and emitter layers are formed, illustrating a photoresist and photomask formed on top of the emitter layer to define an emitter mesa.

FIGS. 1–9 illustrate a method for utilizing self-alignment of the base metal contacts. Referring to FIG. 1, the semiconductor is formed with a vertically integrated profile including a GaAs substrate 20, an n+ collector contact layer 22, an n– collector 24, a p+ base 26 and an emitter layer 28. Each of the epitaxial layers may be formed by conventional methods, such as molecular beam epitaxy (MBE) or metal organic chemical vapor deposition (MOCVD), all within the ordinary skill in the art and disclosed in U.S. Pat. Nos. 5,298,439 and 5,344,786, hereby incorporated by reference. Representative thicknesses of each of the epitaxial layers (20, 22, 24, 26 and 28) are provided in Table 1 below.

TABLE 1

| EPITAXIAL LAYER | THICKNESS |
| --- | --- |
| substrate | 25 mils |
| n+ collector contact | 7000 Å |
| n– collector | 6000 Å |
| p+ base | 1400 Å |
| emitter | 2650 Å |

Figure 2:
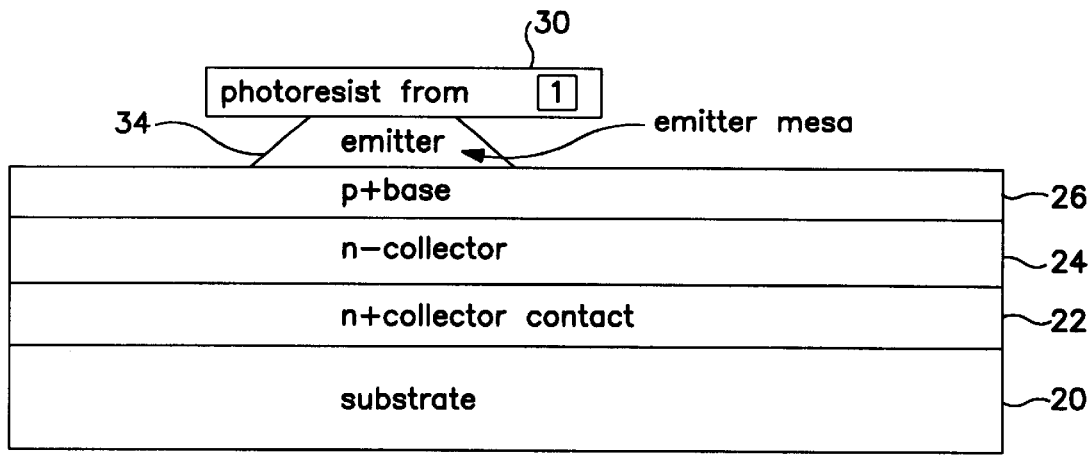
FIG. 2 is similar to FIG. 1 illustrating the semiconductor after etching of the emitter mesa.

Referring to FIG. 1, a photoresist 30 is spun on top of the whole wafer or the emitter layer 28. A photomask 32 is provided where the photoresist will be left on the emitter layer 28 after development, which will define an emitter mesa and also define access to the p+ base layer 26. The photoresist layer is dimensioned to provide a predetermined amount of overhang relative to an emitter mesa, which, in turn, will determine the base ohmic metal distance to the emitter mesa. After exposure and development of the photoresist 30, an emitter mesa 34 (FIG. 2) may be formed by various etching methods, for example, isotropic wet chemical etching or dry anisotropic etching, as generally shown in FIG. 2. The photoresist 30, used to define the emitter mesa 34, as well as the base contact access, is left in place.

Figure 3:
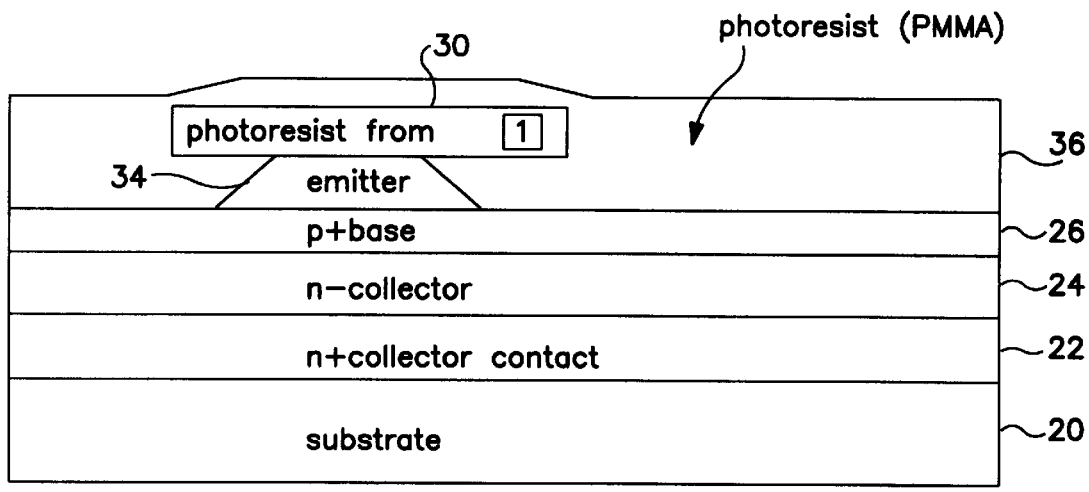
FIG. 3 illustrates step of applying a PMMA photoresist to the semiconductor formed in FIG. 2.
Figure 4:
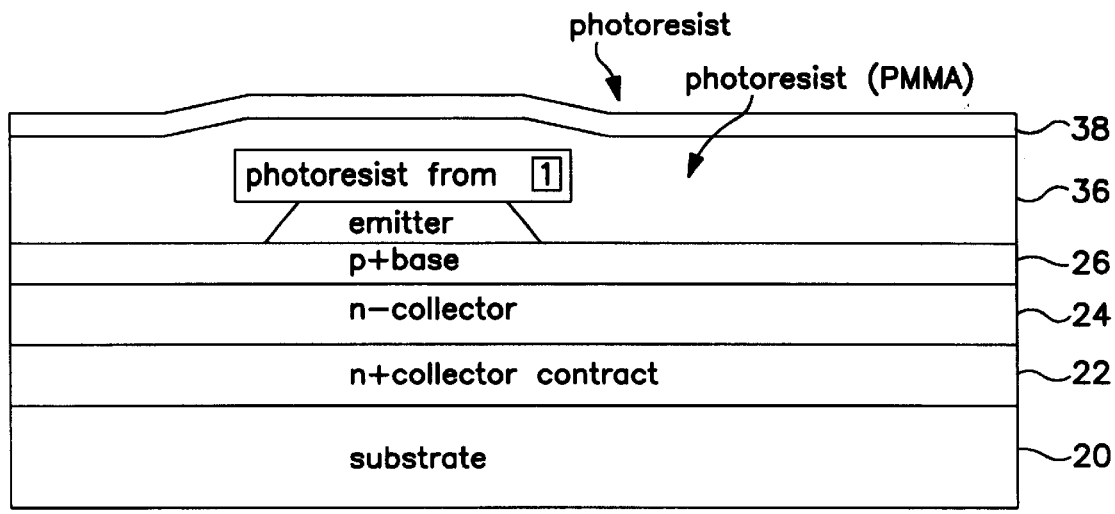
FIG. 4 is similar to FIG. 3 and illustrates the step of adding a photoresist coating on top of the PMMA photoresist before development.
Figure 5:
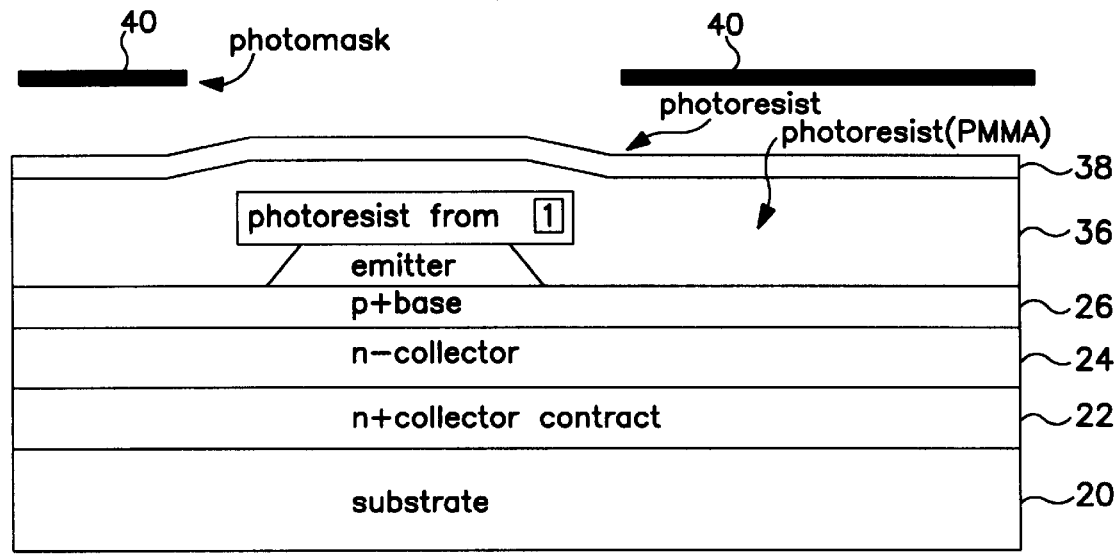
FIG. 5 is similar to FIG. 4 illustrating the step of utilizing a photomask to define the base metal contacts.
Figure 6:
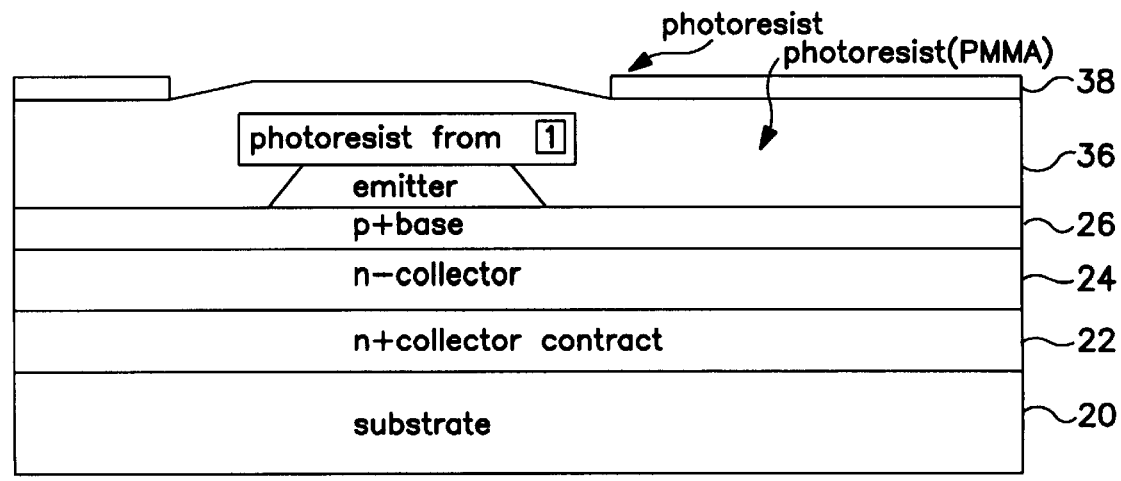
FIG. 6 is similar to FIG. 5 but illustrating the development of upper layer of photoresist.
Figure 7:
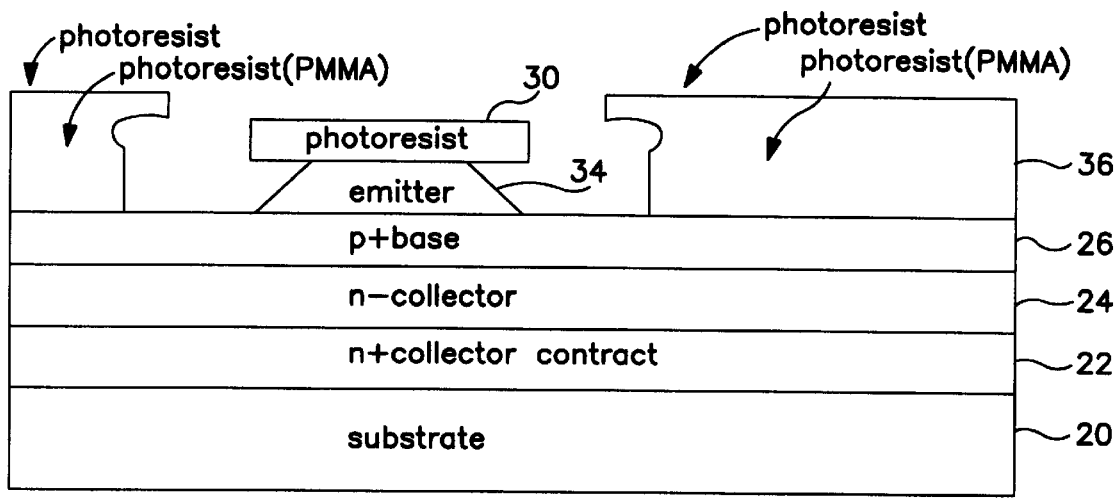
FIG. 7 is similar to FIG. 6 and shows the development of the PMMA of the double layer of photoresist and PMMA and the photoresist on the emitter mesa from the previous photoresist level, which defines the emitter mesa, as well as provides or the base ohmic metal-to-emitter mesa spacing or self-alignment.

As shown in FIG. 3, about 17,000 Å of a polymethylmethacrylate (PMMA) photoresist 36 is applied on the top layers of the semiconductor. An additional photoresist layer 38 is applied on top of the PMMA photoresist 36 as generally illustrated in FIG. 4. As shown in FIGS. 3 and 4, the photoresist layer 30 is left in place. As shown in FIG. 5, a photomask 40 patterns the photoresist (not PMMA) to define the base metal contacts for non-critical lateral alignment. Exposure and development of the photoresist layer 38 by way of the photomask 40 removes a portion of the top layer of photoresist 38 as generally shown in FIG. 6, leaving an exposed portion of the PMMA photoresist 36. The PMMA photoresist 36 is then developed and descummed as generally shown in FIG. 7. The descum process consists of placing the wafer in an oxygen plasma to cause oxidation of the photoresist and PMMA. The time is determined by the etch rate to result in a p-ohmic metal-to-emitter mesa spacing of 0.2 $\mu$m±0.05 $\mu$m. After development of the PMMA photoresist 36, the photoresist 30, as well as the emitter mesa 34, are exposed. In addition, portions of the p+ base epitaxial layer 26, as generally shown in FIG. 7, are also exposed.

Figure 9:
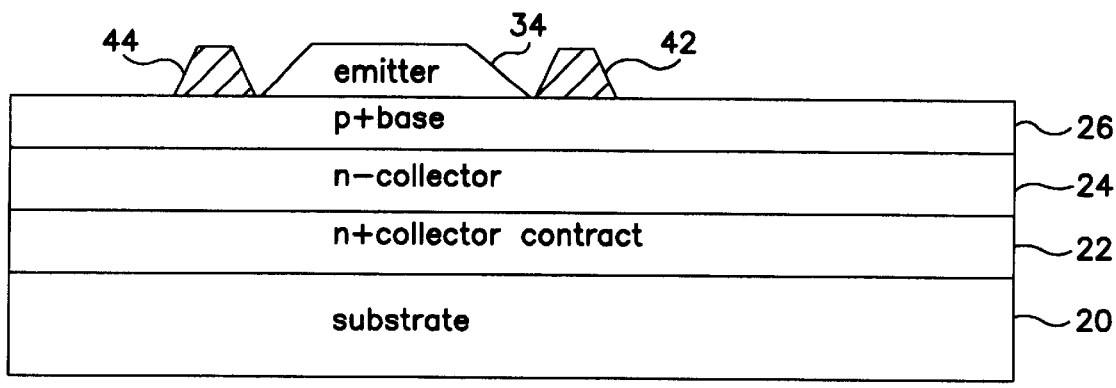
FIG. 9 is similar to FIG. 8, illustrating the ohmic metalization lift-off.
Figure 8:
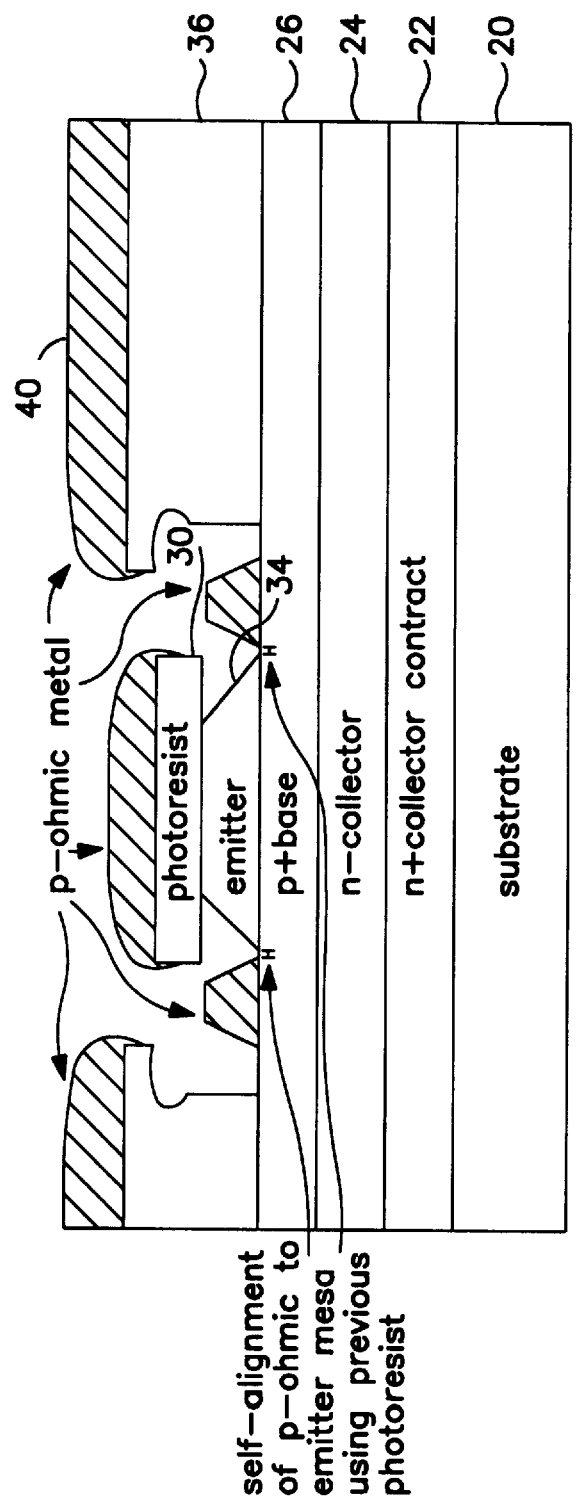
FIG. 8 is similar to FIG. 7, illustrating the metalization of the ohmic contacts.

A photoresist layer 30 overhangs the emitter mesa 34 to provide, for example, a 0.2 $\mu$m±0.05 $\mu$m spacing from the edge of the emitter mesa 34 relative to the p-ohmic metal 42 and 44. The configuration of the photoresist 30, as well as the PMMA photoresist 36, after development, provide for self-alignment of the base metal contacts, spaced away from the emitter mesa 34, for example 0.2 $\mu$m±0.05 $\mu$m. As such, a p-ohmic metal 40 may be deposited on top of the structure, for example by e-beam evaporation. As shown in FIG. 9, the photoresist 30 is removed, which, in turn, lifts off the ohmic metalization on the photoresist 30, as well as the double layer of photoresist and PMMA 36 and 38, leaving the base ohmic contacts 42 and 44 as generally shown in FIG. 9.

Figure 10:
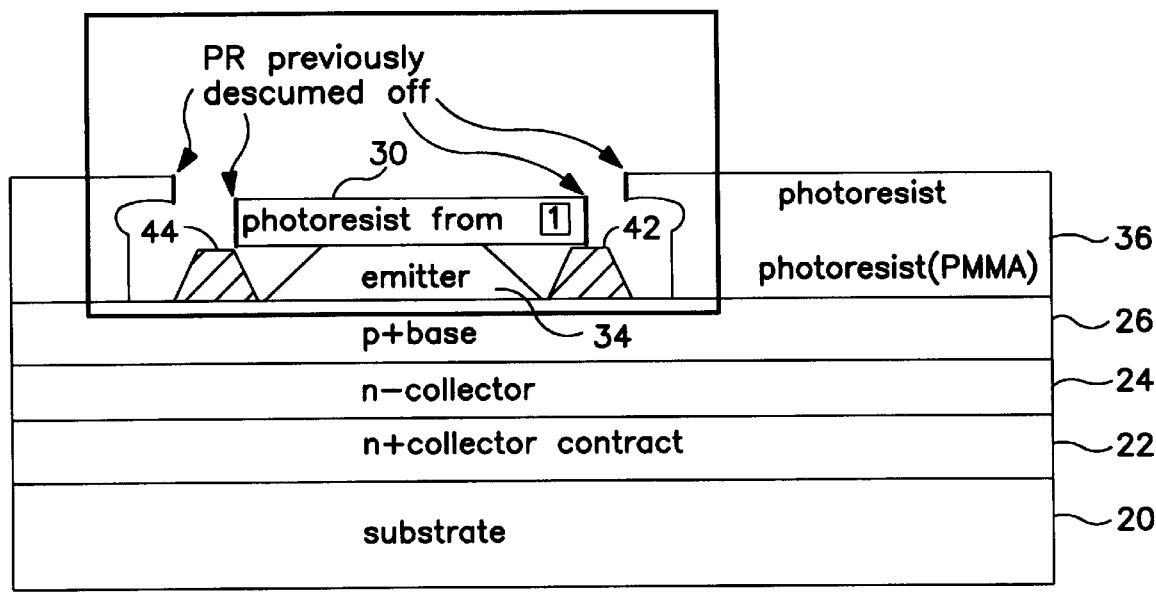
FIG. 10 is similar to FIG. 7 but exaggerated to illustrate the effect of lowering the descum time for the photoresist.
Figure 11:
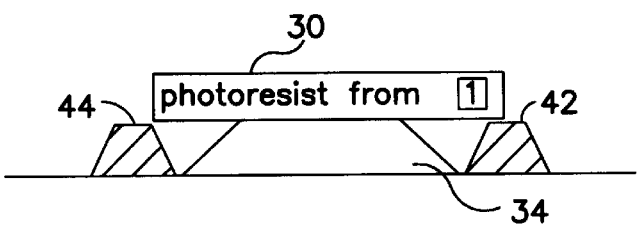
FIG. 11 is similar to FIG. 9 and shows the effect of utilizing a longer descum time for the photoresist on the spacing between the base metal contacts and the emitter mesa.
Figure 12:
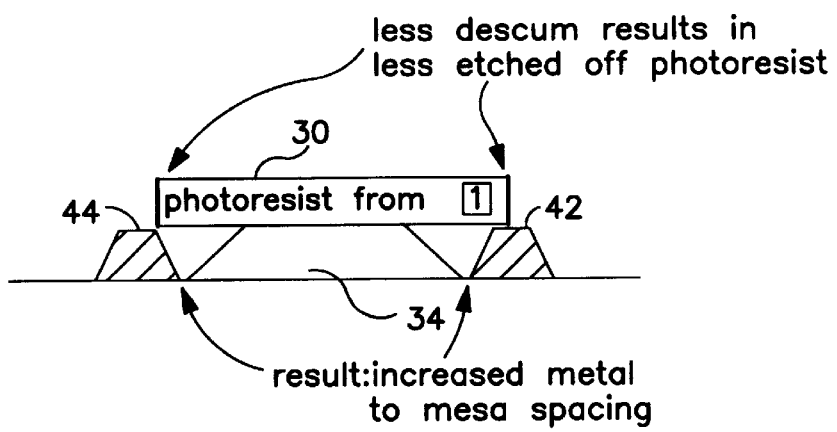
FIG. 12 similar to FIG. 11 and illustrates the effect of lowering the descum time on the spacing between the base metal contacts the emitter mesa.

As generally shown in FIGS. 10–12, the spacing between the base metal contacts 42 and 44 and the emitter mesa can be controlled by the length of time the photoresist layer 30 is descummed. As generally shown in FIG. 10, the PMMA photoresist layer 36 is removed in the area of the emitter mesa as generally shown in FIG. 10. As shown in FIGS. 11 and 12, the length of the descumming controls the amount of overhang of the photoresist 30 relative to the emitter mesa 34. As shown in FIG. 11, longer descumming time decreases the amount of overhang of the photoresist 30 relative to the emitter mesa 34, thereby causing the base metal contacts 42 and 44 to be relatively closely spaced relative to the emitter mesa 34. By decreasing the descumming time, less of the photoresist 30 is etched off, resulting in a relatively longer overhang of the photoresist 30 with respect to the emitter mesa 34. The increased overhang of the photoresist 30 provides increased spacing between the base metal contacts 42 and 44 and the emitter mesa. The descum time is determined by the etch rate. The descum time to result in a p-ohmic metal 42 and 44 spacing-to-emitter mesa 34 of 0.2 $\mu$m±0.05 $\mu$m is chosen.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A structure for making a heterojunction bipolar transistor (HBT) with self-aligned base metal contacts, the structure comprising:

a plurality of epitaxially grown layers, stacked one on top of another, including a substrate layer, a collector contact layer, a collector layer, a base layer and an emitter layer;

an emitter mesa formed on said base layer: and a photoresist structure configured to enable self-alignment of the base metal contact relative to the emitter mesa, said photoresist structure including a first photoresist and a second photoresist, said first photoresist formed with an overhang adjacent said emitter mesa, said second photoresist disposed over said first photoresist as well as an exposed portion of said base layer and etched adjacent said emitter mesa to form a configuration which enables self-alignment of the base metal contacts.

2. An HBT structure as recited in claim 1, wherein said second photoresist includes polymethylmethacrylate (PMMA).

3. An HBT structure as recited in claim 1, wherein said substrate is formed from GaAs.

4. An HBT structure as recited in claim 1, wherein said collector contact layer is formed from an n+ material.

5. An HBT as recited in claim 1, wherein said collector layer is formed from an n− material.

6. An HBT as recited in claim 1, wherein said base layer is formed from a p+ material.

* * * * *